United States Patent [19]

Hesselgren

[11] Patent Number: 5,006,295
[45] Date of Patent: Apr. 9, 1991

[54] METHOD FOR MAKING A PLURALITY OF LIKE PRINTED CIRCUIT BOARD TEST PIECES AND ARRANGING THEM RELATIVE TO ONE ANOTHER CUTTING ALONG A HOLE ROW CENTER PLANE

[76] Inventor: Tore Hesselgren, Ringvägen 63, S-130 35 Ingarö, Sweden

[21] Appl. No.: 346,178
[22] PCT Filed: Aug. 9, 1988
[86] PCT No.: PCT/SE88/00402
§ 371 Date: Apr. 10, 1989
§ 102(e) Date: Apr. 10, 1989
[87] PCT Pub. No.: WO89/01389
PCT Pub. Date: Feb. 23, 1989

[30] Foreign Application Priority Data

Aug. 10, 1987 [SE] Sweden ................ 8703100

[51] Int. Cl.$^5$ ............................................. B29C 39/12
[52] U.S. Cl. .................................. 264/139; 29/407;
29/412; 29/527.1; 29/559; 51/165 R; 264/40.1;
264/156; 264/160; 264/261; 264/263;
264/272.17
[58] Field of Search ................ 264/25, 40.1, 154, 160,
264/272.17, 261, 263, 156, 139; 51/165 R;
29/407, 412, 527.1, 559

[56] References Cited

U.S. PATENT DOCUMENTS

| | | | |
|---|---|---|---|
| 3,384,955 | 5/1968 | Pierce | 264/272.17 |
| 3,742,182 | 6/1973 | Saunders | 264/25 |
| 3,763,611 | 10/1973 | Duhring et al. | 425/117 |
| 4,534,536 | 8/1985 | Nelson et al. | 425/117 |
| 4,571,322 | 2/1986 | Eichelberger et al. | 264/154 |
| 4,592,138 | 6/1986 | Hesselgren | 249/129 |
| 4,648,211 | 3/1987 | Dawson et al. | 51/165 R |
| 4,648,212 | 3/1987 | Dawson et al. | 51/165 R |
| 4,748,773 | 6/1988 | Dawson et al. | 51/165 R |

Primary Examiner—James Lowe
Attorney, Agent, or Firm—Cushman, Darby & Cushman

[57] ABSTRACT

For facilitating the quality control examination of the metal plating of holes in printed circuit boards, several test pieces are cut from circuit boards. Each test piece includes within its perimeter at least one, and preferably a row of at least three metal plated holes. The perimeter of each test piece, as cut, is notched with outwardly opening grooves so as to fit in a fixture in a preselected disposition. Several test pieces are places in a fixture, which serves as a mould for plastic material. After the plastic material hardens around the test pieces, a portion of the composite of test pieces and hardened plastic is sliced off, at a level which exposes half of each metal plated hole. The grooves allow great precision and simple handling.

6 Claims, 4 Drawing Sheets

METHOD FOR MAKING A PLURALITY OF LIKE PRINTED CIRCUIT BOARD TEST PIECES AND ARRANGING THEM RELATIVE TO ONE ANOTHER CUTTING ALONG A HOLE ROW CENTER PLANE

BACKGROUND OF THE INVENTION

The present invention relates generally to quality control testing of printed circuit boards and especially to preparation of samples to facilitate testing of the quality of printed circuit boards with metallized holes. During hole plating of printed boards, levelness and thickness of the metal plating are most important.

Up to now, the only certain way to be able to make an acceptable estimation is to cut the holes through a center plane. Then, the metal thickness is measured using a microscope. Thus, it is very important that the measuring be made at a plane as near the center plane of a metal plated hole as possible. The error from the center plane to a radius which intersects the measuring plane must not exceed 5 degrees, i.e. at a hole diameter of 1 mm about 50–60 $\mu$ and at 0.3 mm about 10–320 $\mu$.

One of the disadvantages with this method is that it requires considerable amounts of plastic, of which the major part has to be ground away which is both time consuming and expensive. Testing according to this technique is mentioned in Danish patent No. 125 217.

A considerably better way of practising this principle is described in the Swedish patent application No. 8301136-1. Here, the embedded samples are milled to approximately the center of the holes to be tested. Thereafter, material is milled on both sides of the holes so that a narrow raised part is formed which then can be ground for investigation.

This means considerable savings both in time and material compared with the method of the Danish patent.

In principle, this method can be exact enough for holes with a diameter of about 1 mm or larger, but when the hole diameter is 0.3 mmm or smaller, the deviations are too large. Besides, IEC, IPC and US military rules stipulate that three holes in a row are to be tested. The tolerances when drilling printed boards may be around ±50 $\mu$. It might be nearly impossible to get three random holes in a row with a linear deviation of ±10–20 $\mu$.

SUMMARY OF THE INVENTION

This invention proposes an acceptable solution of the above described problem.

BRIEF DESCRIPTION OF THE DRAWINGS

The invention will now be described in detail in connection with the attached drawings, wherein.

DETAILED DESCRIPTION

Figure 1:
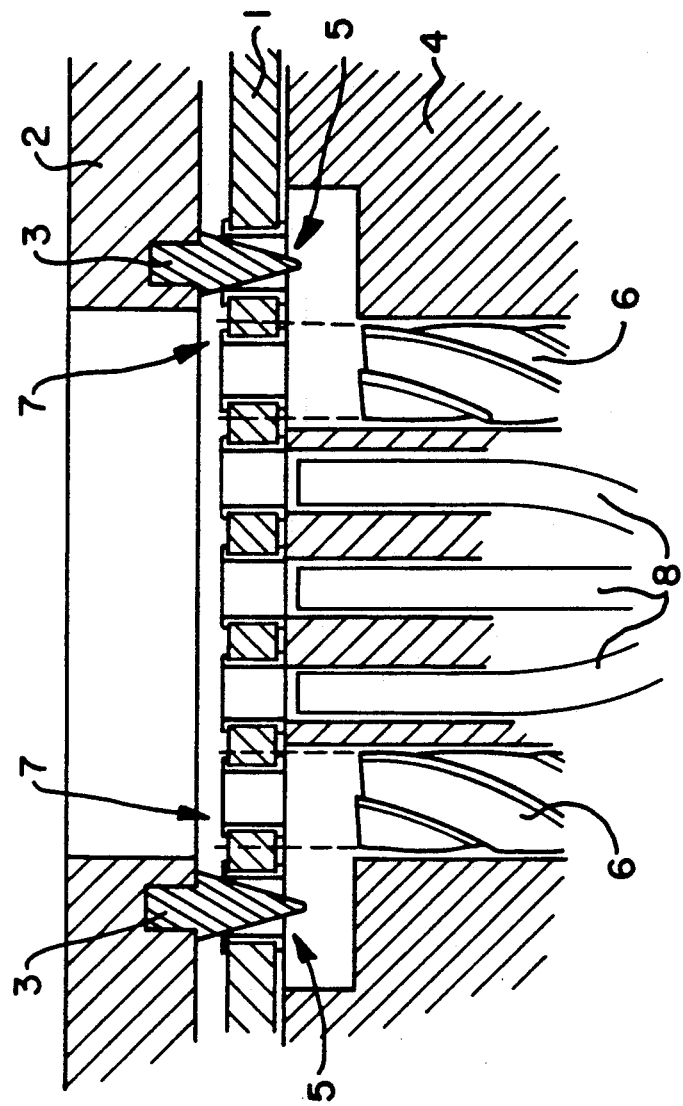
FIG. 1 shows a printed circuit board having a row of metal plated holes, the quality of plating in which is to be investigated.

FIG. 1 shows an arrangement in which a printed board 1 is placed on a support layer 4 and is held in place by a movable and rotating fixture 2 having guiding pins 3.

The printed board is here shown with a row of seven metal-plated holes. The invention proposes, for rather large holes, with a diameter of 1 mm and bigger, to use 7 holes. In such a case, the two end holes 5 of board 1. Are entered by guiding pins 3 on fixture 2 for fixing the location of the row of holes relative to the support layer 4.

If a cutting of, for instance, a test piece having a circular perimeter is made so that the perimeter intersects both of the end holes 7 at such a location that one half or less of the diametrical extent of each remains inside the test piece, these holes 7 can be used for further registration and positioning in instances where the holes have a diameter of 1 mm or more.

If a greater accuracy is necessary, the fixture 2 and support layer 4 are so arranged that a measuring unit, for instance optical fibres 8 placed in channels, can be applied to the printed circuit board as shown in FIG. 1. In such an instance, the fixture 2 with guiding pins 3, guides the board 1 so that the optical measuring unit 8 registers, perhaps with the aid of using data processing, that an optimum has been reached for cutting out a test piece.

Data processing can also be used for estimating if the particular series of plated holes tentatively selected, has its individual holes sufficiently well-centered on a straingt line, that a test piece if cut from the respective portion of the printed circuit board, will be acceptable for further preparation and testing.

To obtain precisely located and sized guide grooves for diametrically opposed sites on a test piece which is to be cut from the printed circuit board, two diametrically opposite holes 21 (index grooves) are milled with through the thickness of the board 1 at the locations of respective end holes 7, using milling cutters. The optimum adjustment is made by shifting the printed circuit board 1 angularly of the axis of the center hole (the one numbered 22 in FIG. 3), and rotating the board 1 around it so that the best possible position for the three holes that are to become located wholly surrounded by the perimeter of the test piece these being the two flanking holes numbered is obtained (14 and the one center hole numbered 22 in FIG. 3).

Figure 2:
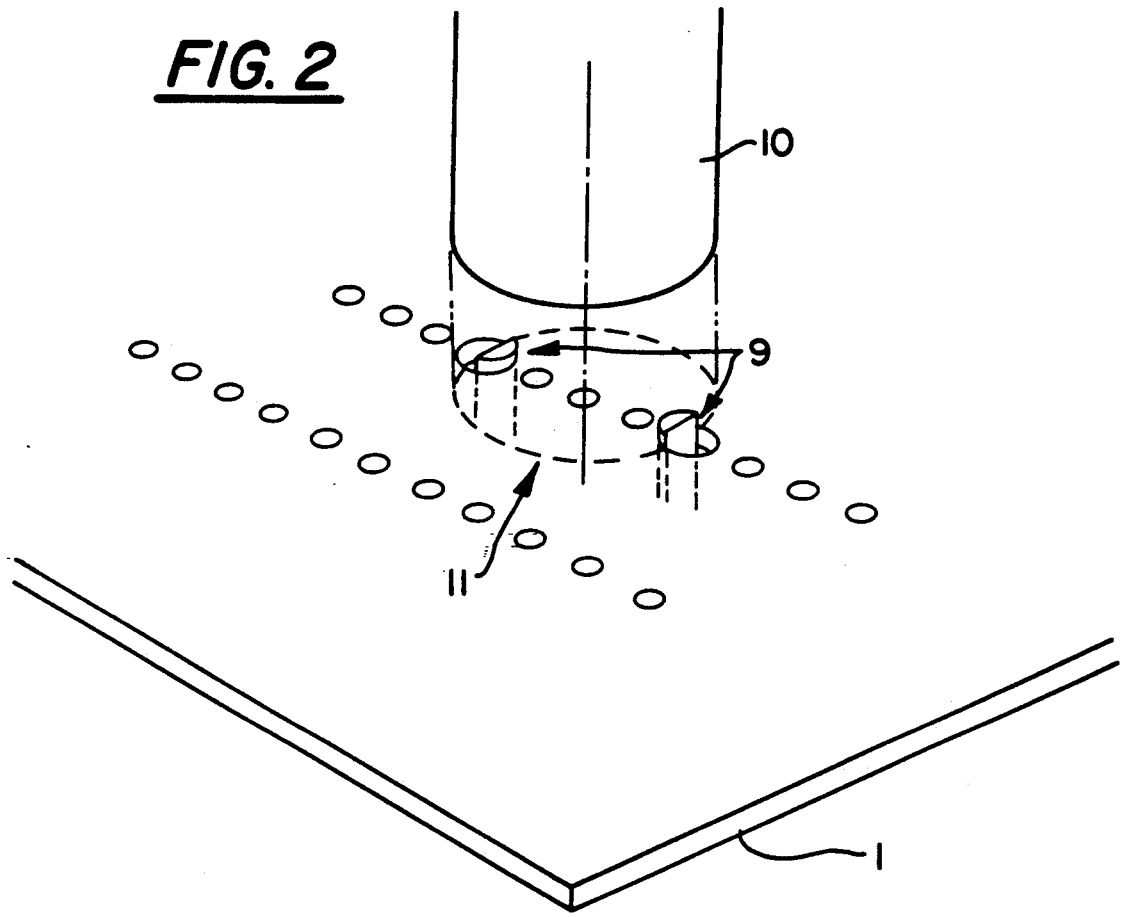
FIG. 2 shows the location of a test piece which is to be cut from the printed circuit board of FIG. 1.

If the data processing shows that the result received is acceptable and the tolerances are within given limits, a workpiece will be made. Its form may be arbitrary, but in the test example, hole cutter 10 (see FIG. 2) was used which cuts out a work-piece 11 having a circular perimeter. During this cutting of a test piece 11 from the board 1, the printed board is held in position the guiding and locking pins 9 which are inserted into the holes 21 made by mills 6. The cutter 10 intersects both holes 21, thereby forming them into diametrically opposed guiding notches.

After a plurality of like test pieces is made in a like manner from different printed circuit boards or other regions of the same printed circuit board, the prepared test pieces 11 are placed in a fixture having parts 12 and 13 (see FIG. 3), with guiding notches or grooves 21 located in line with one another at a common level. The test pieces are held in place by the fixture parts 12 and 13, which are in close resilient contact with the test pieces. The fixture, together with the test pieces kept in position therein, is then inserted in a casting fixture 18 (see FIG. 4) so that the index grooves 21 are received and thereby guided (i.e., fixed at a common level) by a lifting bar 17 provided so as to extend horizontally and protrude in a medial direction from one internal sidewall of one fixture side 16 in the casting fixture. The test pieces 11 are also pressed against the resilient bar 20 in the bottom of the casting fixture (which bar 20 can, for instance, be made of a thin rubber tube).

Another part of the casting fixture, i.e. the side 24 has a bar 23 fixed on its internal sidewall, so as to extend horizontally and protrude in a medial direction, at the same level as the bar 17 on the opposite fixture side 16. Test pieces are guided (i.e., fixed at a common level) by 3 bars 17, 20 and 23. The two notches or grooves 21 on each test piece 11 respectively receive the bars 17 and 23 and, thus, the test pieces with their holes 22 and 14 are thoroughly fixed in level with their rows of holes 22, 14 centered on the with plane 26 which is most suitable for precision grinding for permitting examination of the quality of metal plating in the holes 22, 14.

Figure 3:
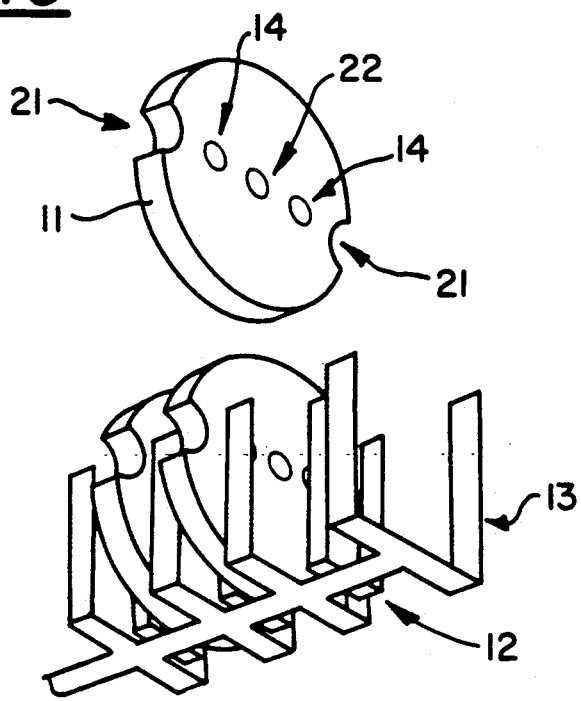
FIG. 3 shows the placing of a plurality of the test pieces cut as in FIG. 2, into a fixture.
Figure 4:
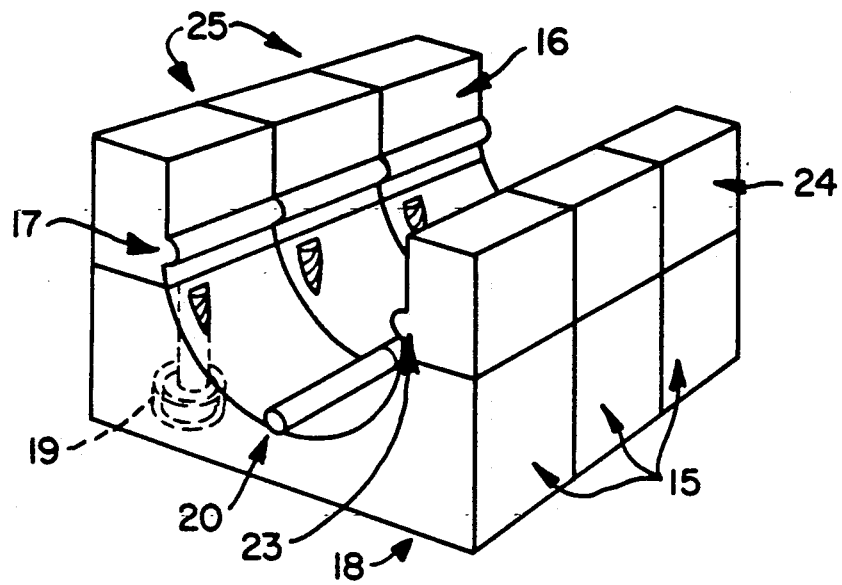
FIG. 4 shows the casting fixture for casting test blocks incorporating the test pieces.

Before the casting procedure, FIG. 3 fixture including the fixture parts 12 and 13 is removed from the test pieces 11, after the test pieces 11 are mounted in the fixture 18, by simply taking it off after the test pieces have been fixed between the bars 17, 20 and 23.

The casting mould which comprises the fixture 18 with its sides 16 and 24, can also include partitions made of, for instance, foil at 25 which divides the casting into several parts 15. The mould is then completed with loose gables (not shown) which cover the short sides and also help keeping parts 16 and 24 in place. Particular fixing screws 19 pierce into the form, and when the casting is completed, these screws keep together the cast units (see FIG. 5). Each cast unit includes a number of the test pieces 11, a part 15 of the fixture 18, a piece of the tube 20, and a body of cast plastic material which fills the space in the fixture 18 about the test pieces 11.

In the casting step, the mould, containing the fixed test pieces is filled with a suitable plastic material which coagulates (i.e., hardens).

Figure 5:
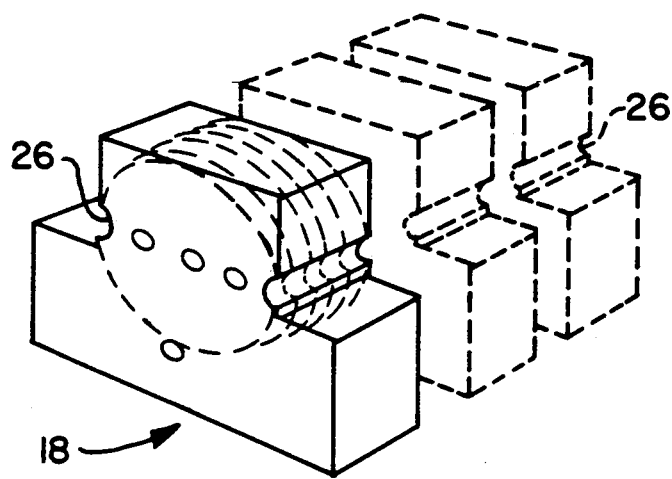
FIG. 5 shows the final test blocks which are to be precision cut along a center plane which runs between the index grooves provided at opposite sides of the test block.
Figure 6:
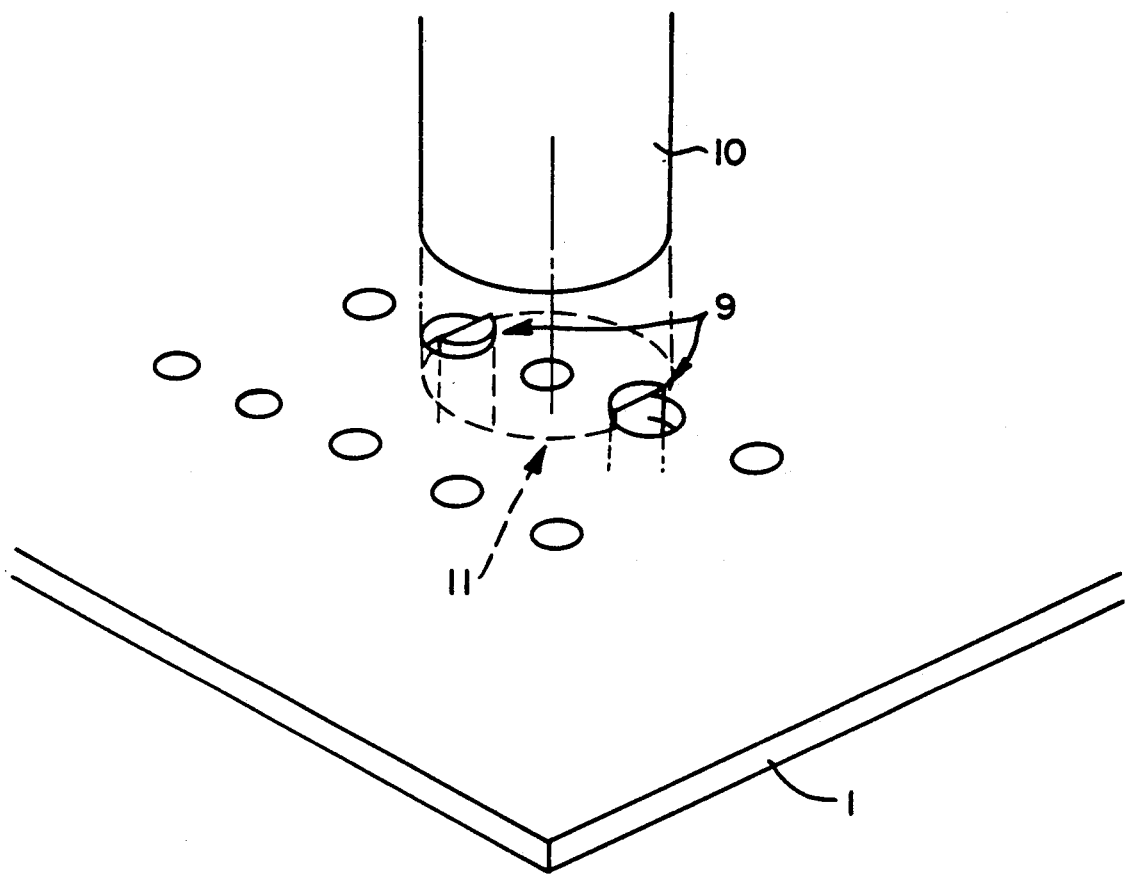
FIG. 6 shows an arrangement with a minimized grinding surface and with only one metalized hole circumscribed by the perimeter of the test piece.

After casting has been completed and when the gables and parts 16 and 24 have been removed, the test packages have the form which is shown in FIG. 5, and then they are ready for precision cutting in a cut along the plane 26 (see FIG. 5), the vertical position of which will be fixed by the area 18 height above the horizontal bottom surface of the fixture 18. The area 18 bottom surface of the fixture 18 is also used during the later-conducted steps of milling and polishing, as a reference to get the cut in an exact position. For the best results, the cut made at the level 26 should be quite through the centers of holes 22 and 14.

Figure 7:
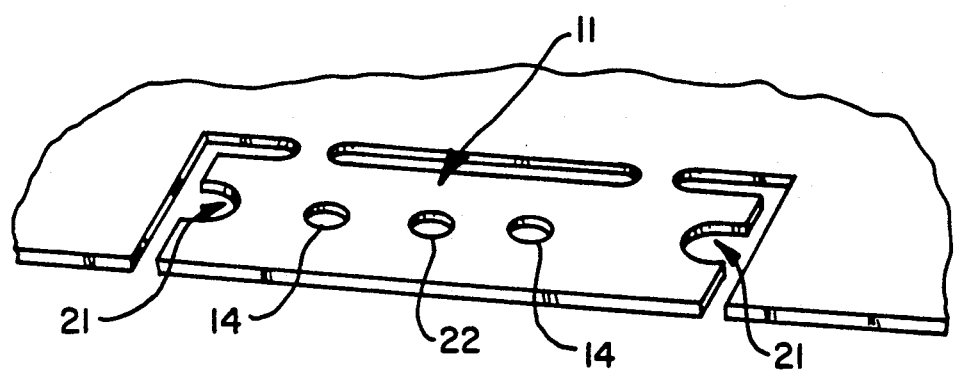
FIG. 7 shows a test piece in which the cutting of holes, index grooves and contours are carried out by a laser. Here, the work-piece is made as a so-called break card.

Of course, the casting mould, as well as the appearance and performance of the test pieces, can be varied within the scope of this invention, and the mills 6 (FIG. 1) can be replaced with drills or with laser processing, and thus, the whole contour including the guiding grooves can be made in other shapes (such as the one which is shown in FIG. 7).

Referring again to FIG. 1 moving the printed circuit board 1 by assistance of the table 2 as a work piece is being cut therefrom, the form of the guiding grooves can be changed, for instance to reduce the area for grinding and optimize the guidance of the work-piece.

When grinding the cut in the test pieces, the edges of the index grooves can directly guide the grinding depth by breaking a laser-light beam.

I claim:

1. A method for preparing a plurality of printed circuit board test pieces for quality control examination of metal plating in holes provided through said test pieces, comprising:

providing a fixture having a mold cavity having an internal wall including at least two longitudinally extending, generally opposed bars;

cutting from at least one circuit board a plurality of test pieces, each including wholly surrounded by the perimeter thereof, at least one metal plated hole and each including in the perimeter thereof at least two generally radially outwardly opening grooves, so that the grooves on each test piece have a peselected uniform spatial relationship to each hole on the respective test piece;

inserting a plurality of test pieces into the mold cavity of the fixture so that the test pieces extend generally transversally of the fixture, in a longitudinally extending series, with each test piece groove receiving a respective bar of the fixture, so that all of said holes through the test pieces are disposed so as to be centered at substantially a common level;

introducing casting plastic material into the mold cavity into interstitial spaces among the test pieces, and allowing the plastic material to harden, thereby forming a composite in which the spatial dispositions of the test pieces are fixed relative to one another; and cutting longitudinally through said composite at said common level, thereby substantially bisecting all of said holes, and thereby exposing remaining-half portions thereof for examination.

2. The method of claim 1, wherein:
said perimeter of each test piece is substantially circular.

3. The method of claim 2, wherein:
said grooves are provided for each test piece by drilling two circular holes through the respective printed circuit board, and, when thereafter cutting the respective test piece from the respective printed circuit board, cutting said printed circuit board along an imaginary circular line which intersects both of said circular holes.

4. The method of claim 3, wherein:
on each test piece, both of said grooves and each said metal plated hole are substantially centered on a diameter of the respective test piece.

5. The method of claim 4, wherein:
each test piece includes at least three said metal plated holes.

6. The method of claim 1, wherein:
each test piece includes at least three said metal plated holes.

* * * * *